(12) United States Patent
Burke et al.

(10) Patent No.: US 8,999,767 B2
(45) Date of Patent: Apr. 7, 2015

(54) ELECTRONIC FUSE HAVING AN INSULATION LAYER

(71) Applicant: International Business Machines Corporation, Armonk, NY (US)

(72) Inventors: Chad M. Burke, Barre, VT (US); Baozhen Li, South Burlington, VT (US); Keith Kwong Hon Wong, Wappingers Fall, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/755,030

(22) Filed: Jan. 31, 2013

(65) Prior Publication Data

US 2014/0210041 A1    Jul. 31, 2014

(51) Int. Cl.
*H01L 21/82* (2006.01)
*H01L 23/525* (2006.01)
*H01L 21/768* (2006.01)
*H01L 23/532* (2006.01)

(52) U.S. Cl.
CPC ...... *H01L 23/5256* (2013.01); *H01L 21/76877* (2013.01); *H01L 23/53295* (2013.01); *H01L 23/53223* (2013.01); *H01L 23/53238* (2013.01); *H01L 23/53266* (2013.01); *H01L 2924/0002* (2013.01)

(58) Field of Classification Search
CPC .................. H01L 23/5252; H01L 23/5256
USPC .................. 257/529, E21.592; 438/131, 132
See application file for complete search history.

(56) References Cited

U.S. PATENT DOCUMENTS

| 6,207,222 | B1 * | 3/2001 | Chen et al. ................. 205/123 |
| 7,423,301 | B2 | 9/2008 | Fujiki et al. |
| 7,651,893 | B2 | 1/2010 | Chen et al. |
| 7,737,528 | B2 | 6/2010 | Bonilla et al. |
| 7,784,009 | B2 | 8/2010 | Booth, Jr. et al. |

(Continued)

FOREIGN PATENT DOCUMENTS

KR     20110132791 A     12/2011

OTHER PUBLICATIONS

Geffken, et al. "Oxidizable Fuse for Integrated Circuit Personalization and Redundancy" published in IPCOM000121739D, Apr. 3, 2005, originally published as TDB n4b Sep. 1991 p. 351; Original Publication Date: Sep. 1, 1991.

(Continued)

*Primary Examiner* — Tucker Wright
*Assistant Examiner* — Mark Hatzilambrou
(74) *Attorney, Agent, or Firm* — Catherine Ivers; L. Jeffrey Kelly

(57) ABSTRACT

A method including etching a dual damascene feature in a dielectric layer, the dual damascene feature including a first via opening, a second via opening, and a trench opening, forming a seed layer within the dual damascene feature, the seed layer including a conductive material, and heating the seed layer causing the seed layer to reflow and fill the first via opening, fill the second via opening, and partially fill the trench opening to form a first via, a second via, and a fuse line, respectively, wherein the seed layer no longer remains along an entire length of a sidewall of the trench opening. The method further including forming an insulating layer on top of the fuse line, and forming a fill material on top of the insulating layer and substantially filling the trench opening.

23 Claims, 3 Drawing Sheets

(56) References Cited

U.S. PATENT DOCUMENTS

| | | |
|---|---|---|
| 7,820,493 B1 | 10/2010 | Cheng et al. |
| 8,101,505 B2 | 1/2012 | Abou-Khalil et al. |
| 2003/0116820 A1* | 6/2003 | Daubenspeck et al. ....... 257/529 |
| 2004/0171263 A1* | 9/2004 | Choi et al. ................... 438/691 |
| 2005/0189612 A1 | 9/2005 | Hung et al. |
| 2009/0051002 A1 | 2/2009 | Booth, Jr. et al. |
| 2011/0156857 A1 | 6/2011 | Kurz et al. |
| 2011/0156858 A1 | 6/2011 | Poppe et al. |
| 2012/0015514 A1* | 1/2012 | Noguchi et al. .............. 438/627 |

OTHER PUBLICATIONS

International Search Report and Written Opinion, PCT/2013/073776, Mar. 27, 2014.

* cited by examiner

ELECTRONIC FUSE HAVING AN INSULATION LAYER

BACKGROUND

1. Field of the Invention

The present invention relates generally to semiconductors, and, more particularly, to electronic fuse interconnect structures.

2. Background of Invention

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration effects to blow and create the open circuit. For example, electromigration can be defined as the transport of material caused by the gradual movement of ions in a conductor due to the momentum transfer between conducting electrons and diffusing metal atoms. In e-fuses that take advantage of electromigration effect, such transport of material caused by the gradual movement of ions can produce voids which cause the e-fuse to blow and create the open circuit or an increase in resistance above a pre-set target.

However, in a typical e-fuse electromigration may cause unpredictable voids, thus potentially creating the open circuit in undesirable locations. Furthermore, typical e-fuse programming may require high programming currents and long programming times. Such programming currents and times may result in unpredictable void formation during programming which may negatively affect other circuits adjacent to the e-fuse. Therefore, it may be desirable to program an e-fuse with lower programming currents and shorter programming times. In addition, predictable and repeatable void formation may also be preferred.

Accordingly, there exists a need in the art to overcome the deficiencies and limitations described hereinabove.

SUMMARY

According to one exemplary embodiment of the present invention, a method of forming an electronic fuse is provided. The method may include etching a dual damascene feature in a dielectric layer, the dual damascene feature including a first via opening, a second via opening, and a trench opening, forming a seed layer within the dual damascene feature, the seed layer including a conductive material, and heating the dielectric layer and the seed layer causing the seed layer to reflow and fill the first via opening, the second via opening, and partially filling the trench opening to form a fuse line, a first via, and a second via. The method further including forming an insulating layer on top of the fuse line, and forming a fill material on top of the insulating layer and substantially filling the trench opening.

According to one embodiment of the present invention, an electronic fuse structure is provided. The electronic fuse structure may include a dual damascene feature in a dielectric layer, the dual damascene feature including a first via, a second via, and a trench, the first via, the second via being filled with a conductive material, a fuse line at the bottom of the trench on top of the first via and the second via, the fuse line including the conductive material, an insulating layer on top of the fuse line and along a sidewall of the trench, and a fill material on top of the insulating layer and substantially filling the trench.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 2 depicts an $M_{x+1}$ dielectric layer on top of an $M_x$ level according to an exemplary embodiment.

FIG. 3 depicts the formation of a dual damascene feature according to an exemplary embodiment.

FIG. 4 depicts the formation of a seed layer according to an exemplary embodiment.

FIG. 5 depicts an annealing technique according to an exemplary embodiment.

FIG. 6 depicts the final e-fuse structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
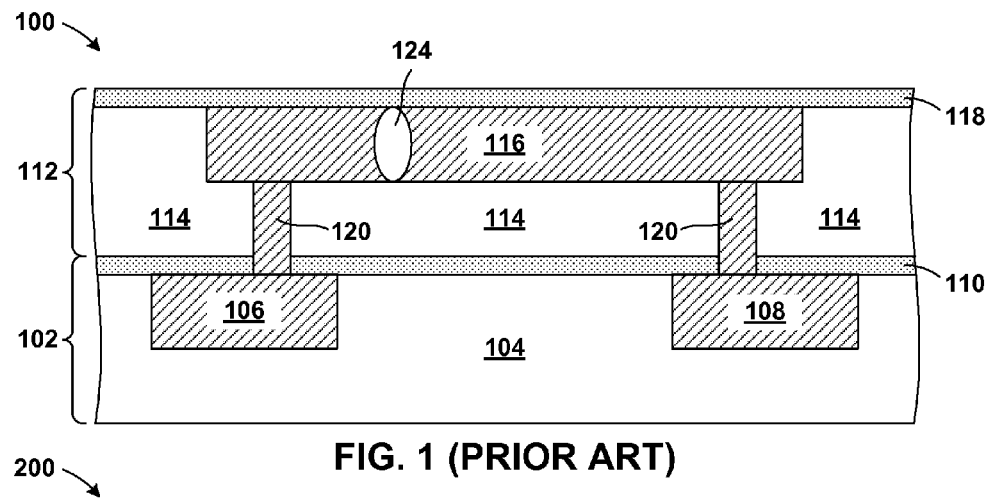
FIG. 1 depicts a cross-sectional view of a typical e-fuse structure after programming according to the prior art.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates generally to an e-fuse structure, and more particularly, to an e-fuse structure containing an insulation layer which may effectively reduce the vertical thickness of a fuse line. The e-fuse structure may include a trench having the fuse line, the insulation layer, and a fill material. Reducing the vertical thickness of the fuse line may increase current density during programming and therefore improve the programming reliability. One via may be located at either end of the fuse line to form an electrical connection between the fuse line and the surrounding circuitry. For example, the fuse line may be connected by two vias, both below the fuse line.

Advantageously, the formation of the e-fuse structure of the present invention can be implemented in the back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present invention thus allows the e-fuse to be fabricated during normal interconnect process flows, thus advantageously reducing processing costs for manufacturing e-fuses which are normally fabricated in different process flows.

More specifically, multilayer electronic components include multiple layers of a dielectric material having metallization on each layer in the form of vias, pads, straps connecting pads to vias, and wiring. Vias or other openings in the dielectric layer extend from one layer to another layer. These openings are filled with a conductive material and electrically connect the metallization of one layer to the metallization of another layer and provide for the high density electronic component devices now used in industry. The metallization of each dielectric layer may be formed using a filling technique such as electroplating, electroless plating, chemical vapor deposition, physical vapor deposition or a combination of methods. The metallization and dielectric layer may be capped with a cap dielectric, which may be, for example, a silicon nitride, or a silicon carbon nitride ($SiC_xN_yH_z$) such as N-Blok. In the present case, the metallization of a particular dielectric layer, in a particular region, may be referred to as a fuse line as will be described in detail below.

By way of example FIG. 1 illustrates a structure 100 having a typical e-fuse structure in which the electromigration failure mode of the e-fuse structure after programming is depicted. The e-fuse may include an $M_x$ level 102 and an $M_{x+1}$ level 112. The $M_x$ level 102 may include an $M_x$ dielectric 104 and two $M_x$ metals 106, 108. The $M_{x+1}$ level 112 may include an $M_{x+1}$ dielectric 114, a fuse line 116, and two vias 120. An $M_x$ cap dielectric 110 may be located between the $M_x$ dielectric 104 and the $M_{x+1}$ dielectric 114 and electrically insulate the $M_x$ metals 106, 108 from the fuse line 116. An $M_{x+1}$ cap dielectric 118 may be located above the $M_{x+1}$ dielectric 114 and electrically insulate the $M_{x+1}$ level 112 from additional interconnect levels (not shown) that may be subsequently formed above.

The vias 120 may electrically connect the fuse line 116 to the $M_x$ metals 106, 108. The $M_x$ metals 106, 108, the vias 120, and the fuse line 116 make up a typical e-fuse. The e-fuse is a structure that may be blown in accordance with the application of a suitable electrical current. For example, an electrical current may be provided through the e-fuse to eventually cause the e-fuse to blow and create an open circuit. Programming refers to blowing an e-fuse and creating the open circuit or an increase in resistance above a pre-set target. A suitable electrical current depends on the e-fuse design and may range from about 1 mA to about 25 mA, and ranges there between. Alternatively, programming may occur at a threshold current density. For example, a typical current density of 100 $mA/cm^3$ may be required to program the e-fuse. Additionally, a circuit may be considered to be programmed, and open, when the e-fuse resistance increases more than an order of magnitude over the initial pre-programmed resistance of the e-fuse. During programming of the e-fuse, a void 124 may form in unexpected locations due to non-optimized processing. Location of the void 124 may be uncontrollable and may affect the yield and reliability of the e-fuse. The void 124 is due in part to the electromigration of conductive interconnect material within the e-fuse. Furthermore, high programming currents and long programming times may be required during programming. Such programming currents and times may result in unpredictable void formation which may negatively affect other circuits adjacent to the e-fuse.

Ideally, low programming currents and short programming times are preferable when programming an e-fuse. One way to achieve lower programming currents and shorter programming times may include effectively reducing the vertical thickness of a fuse line. One embodiment by which to achieve lower programming currents and shorter programming times by adding an insulation layer is described in detail below by referring to the accompanying drawings FIGS. 2-6. The present embodiment may be incorporated into fuse regions of a structure as opposed to non-fuse regions of a structure.

Figure 2:
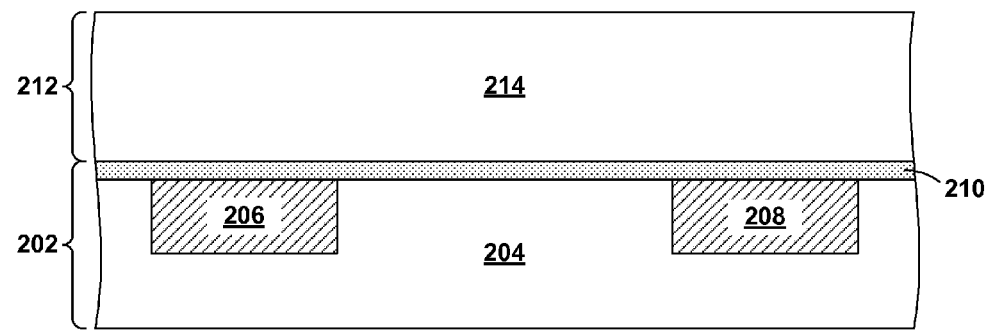
FIGS. 2-6 illustrate the steps of a method of forming an e-fuse according to an exemplary embodiment.

Referring now to FIG. 2, a structure 200 is shown. The structure 200 may include an $M_x$ level 202 and an $M_{x+1}$ level 212. The $M_x$ level 202 may include an $M_x$ dielectric 204, a first $M_x$ metal 206, a second $M_x$ metal 208, and an $M_x$ cap dielectric 210. The $M_x$ level 202 may be any interconnect level in the structure 200. The $M_x$ dielectric 204 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the $M_x$ dielectric 204. The $M_x$ dielectric 204 may have a typical thickness ranging from about 100 nm to about 150 nm and ranges there between, although a thickness less than 100 nm and greater than 150 nm may be acceptable. It should be noted that while only a single interconnect level is shown, the structure 200 may have multiple interconnect levels above and below the $M_x$ level 202.

The first and second $M_x$ metals 206, 208 may be formed in the $M_x$ dielectric 204 in accordance with typical lithography techniques. Both the first and second $M_x$ metals 206, 208 may consist of a typical line or wire found in a typical semiconductor circuit. The first and second $M_x$ metals 206, 208 may be substantially similar structures and may be fabricated using, for example, a typical single or dual damascene technique in which a conductive interconnect material may be deposited in a trench formed in the $M_x$ dielectric 204.

In one embodiment, the first and second $M_x$ metals 206, 208 may include various barrier liners (not shown). One barrier liner may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

With continued reference to FIG. 2, the $M_x$ cap dielectric 210 may be deposited over the structure 200. The $M_x$ cap dielectric 210 may electrically insulate the $M_x$ level 202 from additional interconnect levels (not shown) that may be subsequently formed above the $M_x$ level 202, for example the $M_{x+1}$ level 212. The $M_x$ cap dielectric 210 may be used to improve interconnect reliability and prevent copper from diffusing into an $M_{x+1}$ dielectric that may be subsequently formed above. The $M_x$ cap dielectric 210 may be deposited using typical deposition techniques, for example, chemical vapor deposition. The $M_x$ cap dielectric 210 may include any suitable dielectric material, for example, silicon nitride ($Si_3N_4$), silicon carbide (SiC), silicon carbon nitride (SiCN), hydrogenated silicon carbide (SiCH), or other known capping materials. The $M_x$ cap dielectric 210 may have a thickness ranging from about 20 nm to about 60 nm and ranges there between, although a thickness less than 20 nm and greater than 60 nm may be acceptable. Next, the $M_{x+1}$ level 214 may be formed above the $M_x$ level 202. The $M_{x+1}$ level 214 may include an $M_{x+1}$ dielectric 214. The $M_{x+1}$ dielectric 214 may be substantially similar in all respects to the $M_x$ dielectric 204 described above.

Figure 3:
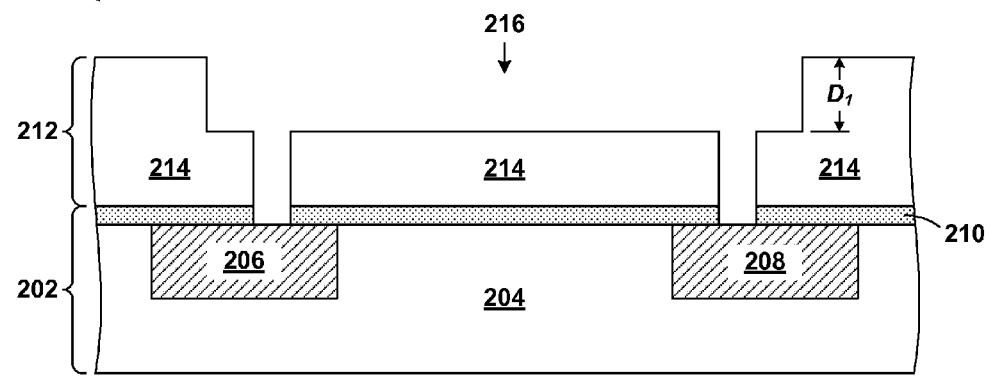

Referring now to FIG. 3, a dual damascene opening 216 may be formed in the $M_{x+1}$ dielectric 214, of the $M_{x+1}$ level 212. The dual damascene opening 216 may include a trench opening and two via openings. The dual damascene opening 216 may be formed using any suitable masking and etching technique known in the art. In one embodiment, a dry etching technique using a fluorine based etchant, such as, for example $C_xF_y$, may be used. The trench opening may have a single depth ($D_1$). In one embodiment, the depth ($D_1$) of the trench opening may range from about 50 nm to about 100 nm. Also, the via openings may extend vertically from the bottom of the trench opening down to the top of the first and second $M_x$ metals 206, 208.

Figure 4:
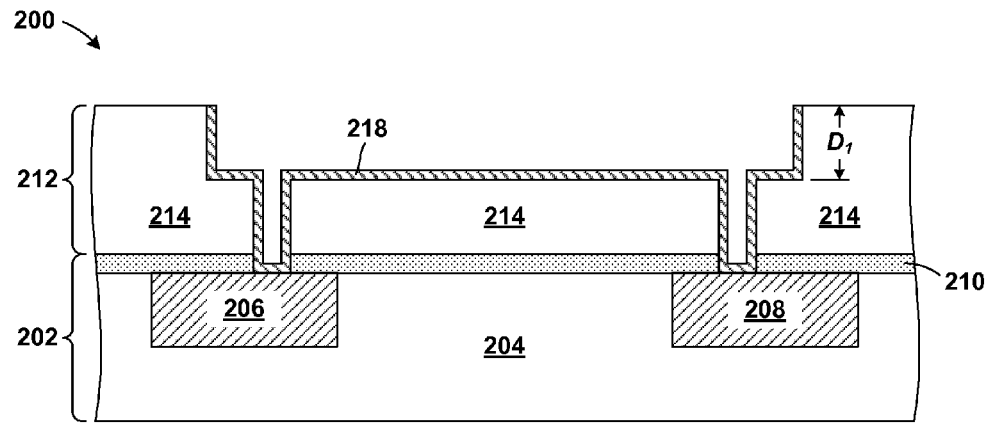
Figure 8:
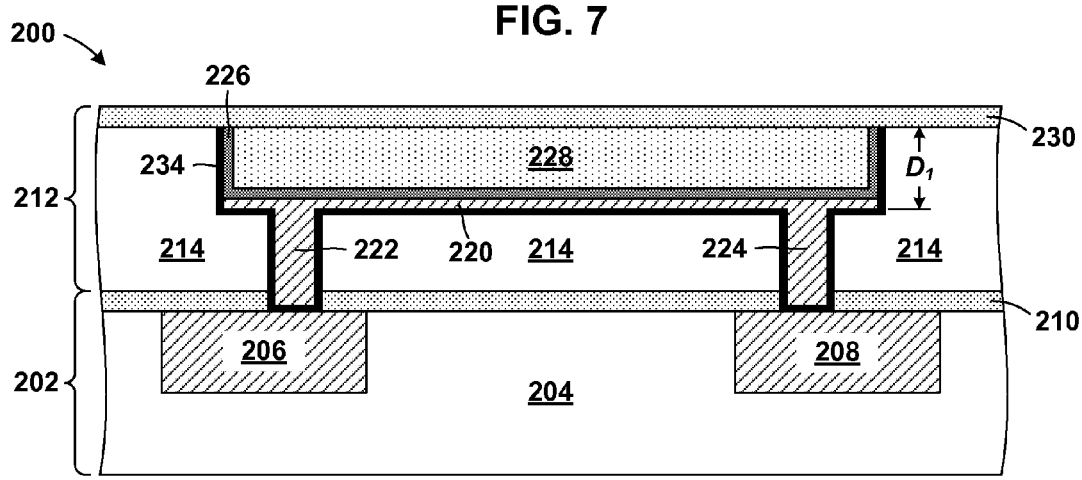
FIG. 8 depicts the final e-fuse structure, including a barrier layer, according to an exemplary embodiment.

Referring now to FIG. 4, a seed layer 218 may be conformally deposited on the structure 200, and more specifically within the dual damascene opening 216. Prior to depositing the 218 seed layer, one or more barrier liner(s) 234 (see FIG. 8) may be deposited, as described above with reference to FIG. 2. The seed layer 218 may include any suitable conductive interconnect material similar to that used in the formation of the first and second $M_x$ metals 206, 208, as described above. In some embodiments, the seed layer 218 may further include dopants, like those described above with reference to FIG. 2. The seed layer 218 may be deposited using any suitable technique known in the art such as physical vapor deposition, atomic layer deposition, plasma enhanced atomic layer deposition, plasma enhanced chemical vapor deposition, or chemical vapor deposition. In one embodiment, for example, the seed layer 218 may include copper deposited using a physical vapor deposition technique. The seed layer 218 may have a thickness ranging from about 1 nm to about 50 nm, and ranges there between. Typically, the seed layer 218 may be deposited prior to filling the dual damascene opening 216 with a conductive interconnect material to ensure complete and uniform coverage of the conductive interconnect material. In the present embodiment, the dual damascene opening 216 may not be subsequently filled with the conductive interconnect material.

Figure 5:
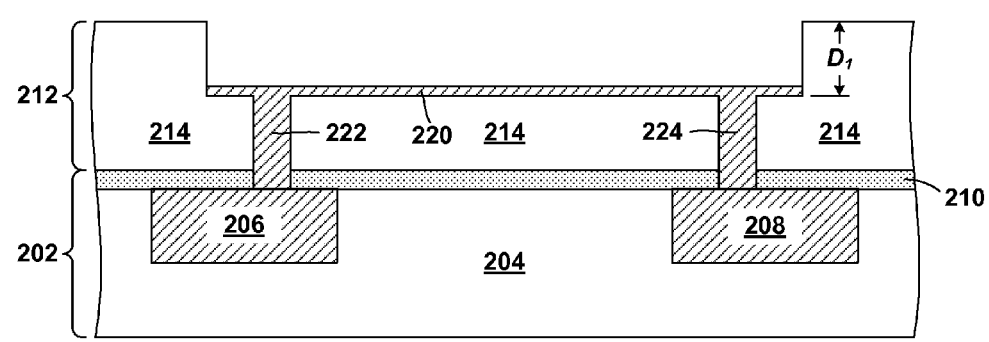

Referring now to FIG. 5, after depositing the seed layer 218, an annealing technique may be performed on the structure 200. The annealing technique may be used to cause the seed layer 218 reflow into the via openings. After the annealing technique the seed layer 218 will form a fuse line 220, a first via 222, and a second via 224. In one embodiment, the annealing technique may be carried out at a relatively low annealing temperature, ranging from about 200° C. to about 350° C. using either a continuous heating regime or various ramp and soak heating cycles, for a duration ranging from about 60 second to about 1 hour. More preferably, the annealing technique may be carried out at an annealing temperature of about 250° C., and for a duration ranging from about 180 seconds to about 30 minutes. As mentioned above, the annealing technique may cause the seed layer 218 to reflow and form the fuse line 220, the first via 222, and the second via 224.

The fuse line 220 may be located at the bottom of the trench opening and form an electrical connection between the first via 222 and the second via 224. In one embodiment, the fuse line 220 may have vertical thickness substantially similar to the initial thickness of the seed layer 218; however, the fuse line 220 may be slightly thicker. The fuse line 220 may preferably be about 10 nm thick. The thickness of the fuse line 220 may be chosen to produce the desired fuse characteristics of the structure.

Vias, generally, may be used to form electrical connections between the metallization of two interconnect levels. The $M_{x+1}$ level 212 may further include the first via 222, and the second via 224. The first via 222 may extend vertically and form a conductive link between the $M_x$ metal 206 and the fuse line 220. The second via 224 may also extend vertically and form a conductive link between the second $M_x$ metal 208 and the fuse line 220. The first via 222 and second via 224 may have an aspect ratio of about 4:1 or more, and a diameter or width ranging from about 10 nm to about 50 nm and ranges there between, although a via diameter less than 10 nm and greater than 50 nm may be acceptable.

The first and second vias 222, 224 may typically be formed concurrent with the trench in the $M_{x+1}$ dielectric level 214, as described above with reference to FIG. 3. For example, the trench, the first via 222, and the second via 224 may be fabricated using a typical double damascene technique in which a conductive interconnect material may be deposited in a via and a trench formed in the $M_{x+1}$ dielectric 214. Like the first $M_x$ metal 206 and the second $M_x$ metal 208, the first via 222, the second via 224, and the fuse line 208 may also include various barrier liners (not shown), as described above.

Figure 6:
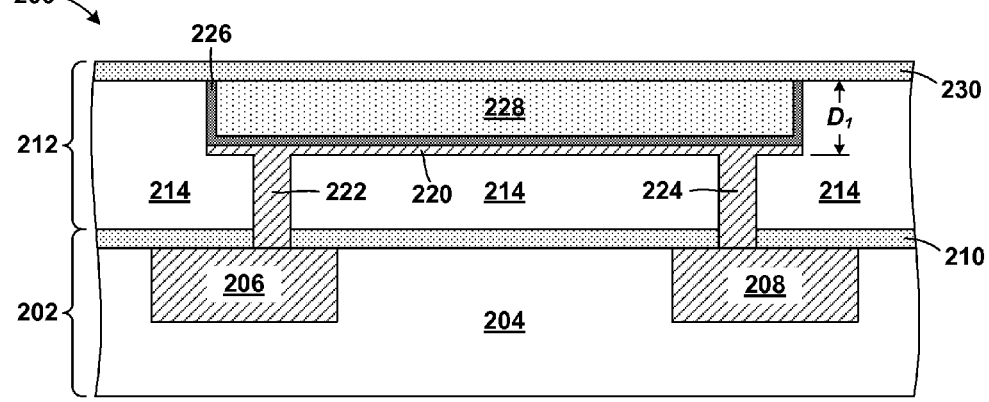

Referring now to FIG. 6, an insulating layer 226 may be formed on top of the fuse line 220. The insulating layer 226 may include any suitable dielectric material known in the art. The insulating layer 226 may be deposited using any suitable deposition technique known in the art such as physical vapor deposition, atomic layer deposition, plasma enhanced atomic layer deposition, plasma enhanced chemical vapor deposition, or chemical vapor deposition. The insulating layer 226 may be conformally deposited within the dual damascene opening 216 (FIG. 3) on top of the fuse line 220. In such cases, the insulating layer 226 may be formed on the sidewalls of the dual damascene opening 216 as well as on top of the fuse line 220. In one embodiment, for example, the insulating layer 226 may include a similar material as the $M_x$ dielectric 204, or the $M_{x+1}$ dielectric 214, as described above. In one embodiment, the insulating layer 226 may include silicon nitride, silicon carbide, or oxygen and hydrogen doped silicon carbide. The insulating layer 226 may have a thickness ranging from about 5 nm to about 100 nm, and ranges there between. A non-critical blocking mask (not shown) may be used to protect non-fuse regions of the structure 200 during the deposition of the insulating layer 226.

Next, a fill material 228 may be deposited on top of the insulating layer 226 substantially filling the dual damascene feature 216 (FIG. 3). The fill material 228 may include any suitable metal or dielectric material known in the art. In one embodiment, the fill material 228 may preferably include a material that which is consonant with current process flows. The fill material 228 may be deposited using any suitable deposition technique known in the art, such as, physical vapor deposition, atomic layer deposition, plasma enhanced atomic layer deposition, plasma enhanced chemical vapor deposition, or chemical vapor deposition. In one embodiment, for example, the fill material 228 may include copper deposited using a chemical vapor deposition technique. Alternatively, in another embodiment, the fill material 228 may include a dielectric material similar to the $M_x$ dielectric 204, or the $M_{x+1}$ dielectric 214, as described above. A chemical mechanical planarization technique may subsequently be used to remove excess material of the insulating layer 226 and the fill material 228 from a top surface of the $M_{x+1}$ dielectric 214. Lastly, an $M_{x+1}$ cap dielectric 230 may be deposited above the structure. The $M_{x+1}$ cap dielectric 230 may be substantially similar in all respects to the $M_x$ cap dielectric 210 described above.

With continued reference to FIG. 6, the final e-fuse structure is shown. Therefore, the first $M_x$ metal 206, the first via 222, the fuse line 208, the second via 224, and second $M_x$ metal 208 may together form the final e-fuse structure. The e-fuse structure may further include the insulating layer 226 positioned directly above the fuse line 220 thereby defining the thickness of the fuse line 208. It should be noted that the insulating layer 226, as described above, may be incorporated into features located in the fuse regions of the structure 200, and not incorporated into features located in the non-fuse regions of the structure 200. The e-fuse structure as depicted in the figures may effectively lower the require programming current and shorten the programming time, thereby increasing programming reliability and efficiency.

Figure 7:
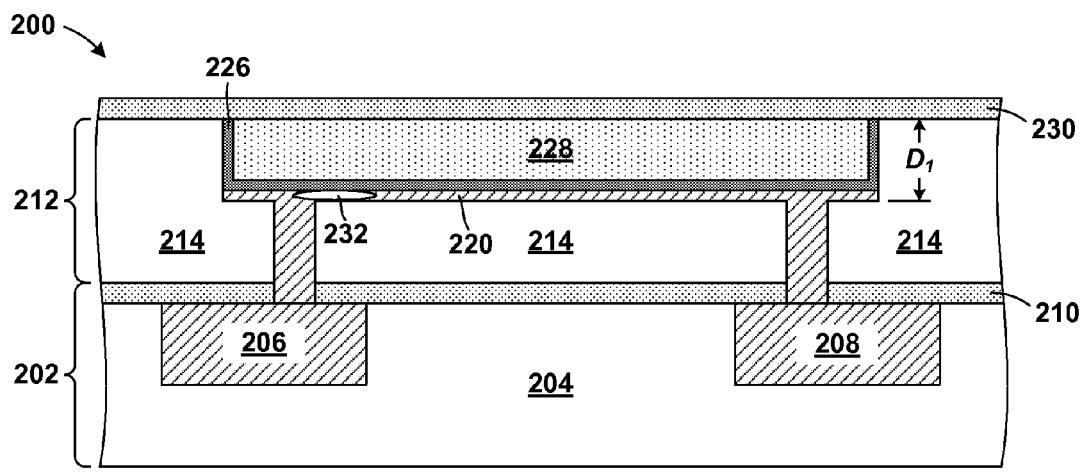
FIG. 7 depicts the final e-fuse structure after programming according to an exemplary embodiment.

Now referring to FIG. 7, the final vertical e-fuse structure is shown after programming. Lower programming currents may be used to programming the e-fuse of the structure 200 because of the reduced vertical thickness of the fuse line 220. The reduced vertical thickness of the fuse line 220 may require lower programming current while maintaining current density. Also, one benefit of using a thinner fuse line is that a smaller void, for example a void 232, may cause an open circuit or sufficiently increase the e-fuse resistance. Therefore, the e-fuse may be programmed in less time and with lower total power which may produce better efficiency and higher yields. Lower total power also reduces the potential to damage neighboring devices. Therefore, the reduce thickness of the fuse line 208 may be primarily responsible for the lower programming currents and shorter programming times.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   etching a dual damascene feature in a dielectric layer, the dual damascene feature comprising a first via opening, a second via opening, and a trench opening;
   forming a seed layer within the dual damascene feature, the seed layer comprising a conductive material;
   heating the seed layer causing the seed layer to reflow and fill the first via opening, fill the second via opening, and partially fill the trench opening to form a first via, a second via, and a fuse line, respectively, wherein the seed layer no longer remains along an entire length of a sidewall of the trench opening;
   forming an insulating layer on top of the fuse line; and
   forming a fill material on top of the insulating layer and substantially filling the trench opening.

2. The method of claim 1, further comprising:
   forming a cap dielectric on top of the dielectric layer and the fill material.

3. The method of claim 1, further comprising:
   forming an $M_x$ level below the dielectric layer comprising a first $M_x$ metal and a second $M_x$ metal, the first via and the second via are in electrical contact with the first $M_x$ metal and the second $M_x$ metal, respectfully.

4. The method of claim 1, further comprising:
   forming a liner within the trench opening, the first via opening, and the second via opening, the liner comprising, tantalum (Ta), tantalum nitride (TaN), cobalt (Co), ruthenium (Ru), or some combination thereof.

5. The method of claim 1, wherein the fill material comprises a dielectric material or a conductive material.

6. The method of claim 1, wherein the seed layer comprises at least one of copper (Cu), manganese (Mn), magnesium (Mg), copper (Cu), aluminum (Al), titanium (Ti), or tungsten (W).

7. The method of claim 1, wherein the insulating layer comprises silicon nitride, silicon carbide, or oxygen and hydrogen doped silicon carbide.

8. The method of claim 1, wherein the fuse line comprises a vertical thickness less than or equal to about 25% of the depth of the trench opening.

9. The method of claim 1, wherein the fuse line comprises a vertical thickness ranging from about 1 nm to about 50 nm.

10. The method of claim 1, wherein a remaining portion of the seed layer along the sidewall of the trench opening does not extend above a top surface of the fuse line.

11. A method comprising:
    etching a dual damascene feature in a dielectric layer, the dual damascene feature comprising a first via opening, a second via opening, and a trench opening;
    forming a seed layer within the dual damascene feature, the seed layer comprising a conductive material;
    heating the seed layer causing the seed layer to reflow and fill the first via opening, fill the second via opening, and partially fill the trench opening to form a first via, a second via, and a fuse line extending from the first via to the second via along a bottom surface of the trench, respectively, wherein the seed layer no longer remains along an entire length of a sidewall of the trench opening;
    forming an insulating layer within the trench opening on top of and in direct contact with the fuse line; and
    forming a fill material on top of the insulating layer and substantially filling the trench opening.

12. The method of claim 11, further comprising:
    forming an $M_x$ level below the dielectric layer comprising a first $M_x$ metal and a second $M_x$ metal, the first via and the second via are in electrical contact with the first $M_x$ metal and the second $M_x$ metal, respectfully.

13. The method of claim 11, further comprising:
    forming a liner within the trench opening, the first via opening, and the second via opening, the liner comprising, tantalum (Ta), tantalum nitride (TaN), cobalt (Co), ruthenium (Ru), or a combination thereof.

14. The method of claim 11, wherein the fill material comprises a dielectric material or a conductive material.

15. The method of claim 11, wherein the fuse line comprises a vertical thickness less than or equal to about 25% of a depth of the trench opening.

16. The method of claim 11, wherein the insulating layer comprises silicon nitride, silicon carbide, or oxygen and hydrogen doped silicon carbide.

17. A method comprising:
- etching a dual damascene feature in a dielectric layer, the dual damascene feature comprising a first via opening, a second via opening, and a trench opening;
- forming a seed layer within the dual damascene feature, the seed layer comprising a conductive material;
- removing an entirety of the seed layer from an entire length of a sidewall of the trench opening by heating the seed layer causing the seed layer to reflow and fill the first via opening and the second via opening to form a first via and a second via, wherein a remaining portion of the seed layer along a bottom surface of the trench opening forms a fuse line extending from the first via to the second via;
- forming an insulating layer within the trench opening on top of and in direct contact with the fuse line; and
- forming a fill material on top of the insulating layer and substantially filling the trench opening.

18. The method of claim 17, further comprising:
- forming an $M_x$ level below the dielectric layer comprising a first $M_x$ metal and a second $M_x$ metal, the first via and the second via are in electrical contact with the first $M_x$ metal and the second $M_x$ metal, respectively.

19. The method of claim 17, further comprising:
- forming a liner within the trench opening, the first via opening, and the second via opening, the liner comprising, tantalum (Ta), tantalum nitride (TaN), cobalt (Co), ruthenium (Ru), or a combination thereof.

20. The method of claim 17, wherein the fill material comprises a dielectric material or a conductive material.

21. The method of claim 17, wherein the fuse line comprises a vertical thickness less than or equal to about 25% of a depth of the trench opening.

22. The method of claim 17, wherein the seed layer comprises at least one of copper (Cu), manganese (Mn), magnesium (Mg), copper (Cu), aluminum (Al), titanium (Ti), or tungsten (W).

23. The method of claim 17, wherein the insulating layer comprises silicon nitride, silicon carbide, or oxygen and hydrogen doped silicon carbide.

* * * * *